US011784503B2

(12) United States Patent
Wolgemuth

(10) Patent No.: US 11,784,503 B2
(45) Date of Patent: Oct. 10, 2023

(54) PASSIVE ARC DETECTION AND MITIGATION IN WIRELESS POWER TRANSFER SYSTEM

(71) Applicant: InductEV Inc., King of Prussia, PA (US)

(72) Inventor: John M. Wolgemuth, Chester Springs, PA (US)

(73) Assignee: InductEV Inc., King of Prussia, PA (US)

( * ) Notice: Subject to any disclaimer, the term of this patent is extended or adjusted under 35 U.S.C. 154(b) by 77 days.

(21) Appl. No.: 17/181,349

(22) Filed: Feb. 22, 2021

(65) Prior Publication Data

US 2022/0271548 A1    Aug. 25, 2022

(51) Int. Cl.
| | | |
|---|---|---|
| H02J 7/00 | (2006.01) | |
| G01R 31/08 | (2020.01) | |
| H02J 50/70 | (2016.01) | |

(52) U.S. Cl.
CPC .......... *H02J 7/0047* (2013.01); *G01R 31/088* (2013.01); *H02J 50/70* (2016.02)

(58) Field of Classification Search
CPC ........ H02J 7/0047; H02J 50/70; G01R 31/088
USPC ....................................................... 320/137
See application file for complete search history.

(56) References Cited

U.S. PATENT DOCUMENTS

| | | |
|---|---|---|
| 4,553,084 A | 11/1985 | Wrathall |
| 6,072,708 A | 6/2000 | Fischer |
| 6,522,517 B1 | 2/2003 | Edel |
| 10,416,196 B2 | 9/2019 | Urankar |
| 10,802,049 B2 | 10/2020 | Park et al. |
| 10,992,149 B1 * | 4/2021 | Kahn ................ H02J 7/0013 |
| 2005/0024016 A1 | 2/2005 | Breen et al. |
| 2006/0203401 A1 | 9/2006 | Kojori et al. |
| 2007/0021937 A1 | 1/2007 | Labuschagne et al. |

(Continued)

FOREIGN PATENT DOCUMENTS

| | | |
|---|---|---|
| CA | 2125026 C | 6/1998 |
| WO | 2018222669 A1 | 12/2018 |

OTHER PUBLICATIONS

International Application No. PCT/US2020/67339, International Search Report and Written Opinion of the National Searching Authority, dated Mar. 23, 2021, 18 pages.

(Continued)

*Primary Examiner* — Nathaniel R Pelton
(74) *Attorney, Agent, or Firm* — Culhane Meadows PLLC; Michael P. Dunnam

(57) ABSTRACT

A charging system for charging a battery includes a rectifier that rectifies power received from an AC power source into a DC signal for charging the battery and an arc detection circuit that measures noise added to the DC signal and generates a measured noise signal. A processor analyzes the measured noise signal to detect a series-arc and, when a series-arc is detected, causes a shunt of the AC current of the rectifier for a period of time to reduce a DC output of the rectifier toward zero. A passive arc detection circuit is inserted between the rectifier and the battery and includes a filter capacitor and a sense resistor in parallel with a smoothing capacitor. A voltage across the sense resistor is amplified, digitized, and outputted as the measured noise signal. The DC signal may be scanned to obtain the measured noise signal in different frequency windows.

14 Claims, 7 Drawing Sheets

(56) References Cited

U.S. PATENT DOCUMENTS

| | | |
|---|---|---|
| 2009/0026845 A1 | 1/2009 | Shin |
| 2010/0164296 A1 | 7/2010 | Kurs et al. |
| 2013/0282312 A1 | 10/2013 | Abeywickrama et al. |
| 2014/0119072 A1 | 5/2014 | Behrends et al. |
| 2014/0142873 A1 | 5/2014 | Kawate et al. |
| 2014/0339916 A1 | 11/2014 | Fells et al. |
| 2015/0194836 A1 | 7/2015 | Teo et al. |
| 2015/0263511 A1* | 9/2015 | Sandner .............. H02H 7/1252 363/53 |
| 2016/0025821 A1 | 1/2016 | Widmer et al. |
| 2016/0181875 A1 | 6/2016 | Long et al. |
| 2016/0294221 A1 | 10/2016 | Maniktala |
| 2017/0207746 A1 | 7/2017 | Yoscovich et al. |
| 2017/0237340 A1 | 8/2017 | Long et al. |
| 2017/0346343 A1 | 11/2017 | Atasoy et al. |
| 2019/0084433 A1 | 3/2019 | Wang et al. |
| 2021/0066904 A1* | 3/2021 | Ionescu ............... H02H 1/0015 |
| 2021/0288610 A1* | 9/2021 | Yoscovich .......... H02H 1/0015 |
| 2022/0091172 A1* | 3/2022 | Varga .................. H02H 1/0015 |

OTHER PUBLICATIONS

Kim, Jonathan C. et al., "DC Arc Fault Model Superimposing Multiple Random Arc Noise States on an Average Model," 2019 20th Workshop on Control and Modeling for Power Electronics, Northeastern University—Department of Electrical and Computer Engineering, Boston, MA, Jun. 17-20, 2019, 8 pages.

Miao, Wenchao et al., "Arc-Faults Detection in PV Systems by Measuring Pink Noise With Magnetic Sensors," IEEE Transactions on Magnetics, vol. 55, No. 7, Jul. 2019, the University of Hong Kong-Department of Electrical and Electronic Engineering, Hong Kong, 6 pages.

Patent Cooperation Treaty, International Application No. PCT/US2022/011866, International Search Report, dated Mar. 29, 2022, 2 pages.

* cited by examiner

PASSIVE ARC DETECTION AND MITIGATION IN WIRELESS POWER TRANSFER SYSTEM

CROSS-REFERENCE TO RELATED APPLICATIONS

The present patent application is related to U.S. Provisional Patent Application Ser. No. 63/010,771, filed on Apr. 16, 2020 and U.S. patent application Ser. No. 16/952,933, filed Nov. 19, 2020, both entitled "SAFETY CIRCUITS FOR WIRELESS POWER TRANSFER" and to U.S. patent application Ser. No. 16/825,624, filed on Mar. 20, 2020, entitled "CURRENT SENSING IN A WIRELESS POWER TRANSFER SYSTEM." The contents of these patent applications are hereby incorporated by reference.

TECHNICAL FIELD

This patent application describes a wireless power transfer assembly as it pertains to wireless charging through use of an inductive wireless power transfer system. The wireless power transfer assembly described herein includes circuitry for the passive detection and active mitigation of a series-arc fault.

BACKGROUND

An arc fault is an unintentional electrical failure within a circuit. Arcs are divided into two types based on a consequent accidental diversion path of the current. Parallel-arcs are defined as formation of the arc in parallel with the load and series-arcs are formed in series with the load.

Parallel arcs create a conductive path in parallel with the load and are characterized by large current flows as the newly formed conductive path is not limited by the load. The newly connected conductive path can be to a second conductor at a lower voltage or a circuit of lower resistance than that of a normal circuit to ground. Parallel-arc faults can produce immediate damage from the very high temperatures due to the high-power dissipation in the circuit.

Series-arcs form a conductive path in series with the load, typically across a loose connector, a break in a conductor (e.g., broken wire) or across an open relay. The series-arc is current limited by the still connected load preventing the current over-draw of a parallel-arc. With the series-arc, due to the load-limited current, damage is erosive, with the local plasma formed by the arc damaging the conductor surfaces and surrounding insulation causing a chain reaction that eventually leads to a thermally-induced mechanical failure of electrical conductors and damage to surrounding structures.

SUMMARY

Various examples are now described to introduce a selection of concepts in a simplified form that are further described below in the Detailed Description. The Summary is not intended to be used to limit the scope of the claimed subject matter.

Sample embodiments relate to a charging system for charging a battery. The charging system includes a rectifier, an arc detection circuit, and a processor of a vehicle charging controller. The rectifier rectifies power received from an alternating current (AC) power source into a direct current (DC) signal for application to the battery for charging, and the arc detection circuit measures noise added to the DC signal and generates a measured noise signal. The processor of the vehicle charging controller analyzes the measured noise signal to detect a series-arc and, when a series-arc is detected, causes a shunt of AC current of the rectifier for a period of time to reduce a DC output of the rectifier toward zero.

In the sample embodiments, the arc detection circuit includes a passive arc detection circuit disposed between the rectifier and the battery. The passive arc detection circuit includes a first path including a filter capacitor and a sense resistor and a second path in parallel with the first path and the battery, the second path including a smoothing capacitor. An analog to digital converter is further provided to digitize a voltage across the sense resistor and the digitized voltage is output to the processor as the measured noise signal. An amplifier may also be provided to amplify the voltage across the sense resistor prior to digitization.

In the sample embodiments, the processor of the vehicle charging controller may be adapted to scan a DC frequency spectrum of a DC output with additive noise of the rectifier to obtain the measured noise signal in a frequency window and to compare the measured noise signal to a detection threshold for the frequency window. A database may also provide to the processor information relating to a receiver assembly including the rectifier. The information may include at least one of data used to inform scanning cycle periodicity, to abort a charging session immediately, to set a number of frequencies to scan, or to adjust at least one frequency window to avoid local noise, ambient noise, or interference. After scanning the DC frequency spectrum of the DC output of the rectifier to obtain the measured noise signal in the frequency window, the processor may detect a series-arc when a detection threshold for the frequency window is exceeded. The processor may further subject a series-arc detection event indicating detection of the series-arc to signal and historical analysis to determine a probability of a false positive detection.

In the sample embodiments, the processor of the vehicle charging controller may further execute instructions to analyze the measured noise signal to detect a series-arc by performing operations including: performing a Fourier Transform (FT) calculation on the measured noise signal to generate FT results; masking the FT results to derive results for pre-selected frequency windows of the DC current output of the rectifier; for each pre-selected frequency window, developing a score based on a frequency amplitude; performing an n-sample integration to average the score over an n-sample time duration to generate an integrated score, where n is a number of samples; for each n-sample time duration, comparing the integrated score to a threshold; and when the threshold is exceeded by the integrated score, triggering a series-arc detection event.

A method implemented by the charging circuit is also described herein. The charging method includes rectifying, using a rectifier, power received from an alternating current (AC) power source into a direct current (DC) signal for application to the battery for charging; measuring, using an arc detection circuit, noise added to the DC signal and generating a measured noise signal; analyzing the measured noise signal to detect a series-arc; and when a series-arc is detected, causing a shunt of AC current of the rectifier for a period of time to reduce a DC output of the rectifier toward zero.

In sample embodiments, measuring noise added to the DC signal includes inserting a passive arc detection circuit between the rectifier and the battery, the passive arc detection circuit comprising a first path including a filter capacitor and a sense resistor and a second path in parallel with the first path and the battery, the second path including a smoothing capacitor. The voltage across the sense resistor is amplified, digitized, and output as the measured noise signal.

In the sample embodiments, generating the measured noise signal may include the passive arc detection circuit scanning a DC frequency spectrum of a DC output with additive noise of the rectifier to obtain the measured noise signal in a frequency window and comparing the measured noise signal to a detection threshold for the frequency window. The method may also include receiving, from a database, information relating to a receiver assembly including the rectifier. In the sample embodiments, the information may include at least one of data used to inform scanning cycle periodicity, to abort a charging session immediately, to set a number of frequencies to scan, or to adjust at least one frequency window to avoid local noise, ambient noise, or interference. After scanning the DC frequency spectrum of the DC output of the rectifier to obtain the measured noise signal in the frequency window, a series-arc may be detected when a detection threshold for the frequency window is exceeded. The method may also include subjecting a series-arc detection event indicating detection of the series-arc to signal and historical analysis to determine a probability of a false positive detection.

In the sample embodiments, analyzing the measured noise signal to detect a series-arc may include the operations of performing a Fourier Transform (FT) calculation on the measured noise signal to generate FT results; masking the FT results to derive results for pre-selected frequency windows of the DC current output of the rectifier; for each pre-selected frequency window, developing a score based on a frequency amplitude; performing an n-sample integration to average the score over an n-sample time duration to generate an integrated score, where n is a number of samples; for each n-sample time duration, comparing the integrated score to a threshold; and when the threshold is exceeded by the integrated score, triggering a series-arc detection event.

This summary section is provided to introduce aspects of the inventive subject matter in a simplified form, with further explanation of the inventive subject matter following in the text of the detailed description. This summary section is not intended to identify essential or required features of the claimed subject matter, and the particular combination and order of elements listed in this summary section is not intended to provide limitation to the elements of the claimed subject matter. Rather, it will be understood that the following section provides summarized examples of some of the embodiments described in the Detailed Description below.

BRIEF DESCRIPTION OF THE DRAWINGS

The foregoing and other beneficial features and advantages of the invention will become apparent from the following detailed description in connection with the attached figures, of which.

DETAILED DESCRIPTION OF ILLUSTRATIVE EMBODIMENTS

Figure 1:
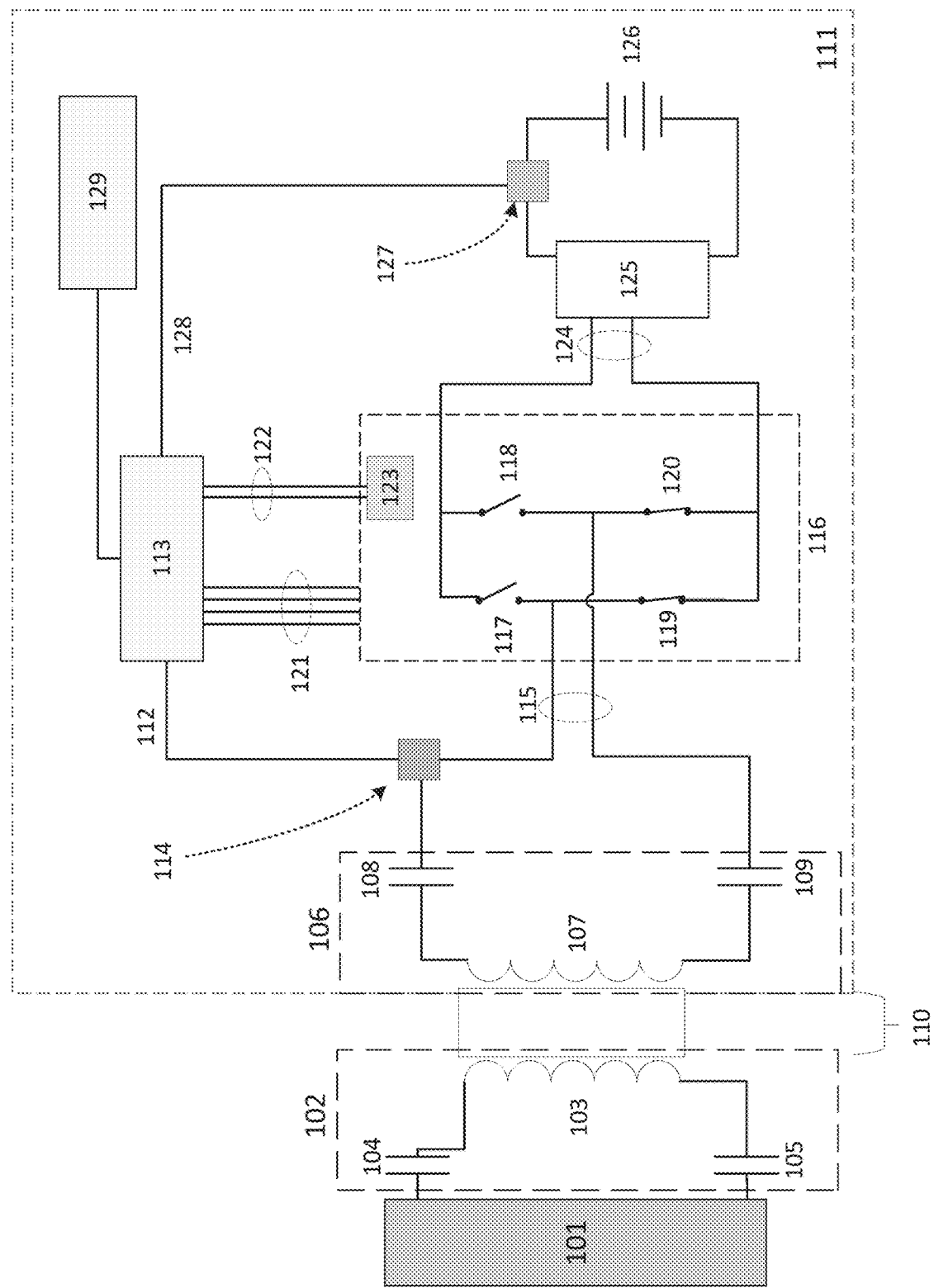
FIG. 1 schematically illustrates a high-level exemplary circuit implementation of a safety enhanced magnetic resonant induction system for the charging of batteries and powering of DC circuitry in a wireless power transfer system.

The current measurement device and associated method described herein may be understood more readily by reference to the following detailed description taken in connection with the accompanying figures and examples that form a part of this disclosure. It is to be understood that this description is not limited to the specific products, methods, conditions, or parameters described and/or shown herein, and that the terminology used herein is for the purpose of describing particular embodiments by way of example only and is not intended to be limiting of any claimed subject matter. Similarly, any description as to a possible mechanism or mode of action or reason for improvement is meant to be illustrative only, and the subject matter described herein is not to be constrained by the correctness or incorrectness of any such suggested mechanism or mode of action or reason for improvement. Throughout this text, it is recognized that the descriptions refer both to methods and systems/software for implementing such methods.

A detailed description of illustrative embodiments will now be described with reference to FIGS. 1-7. Although this description provides a detailed description of possible implementations, it should be noted that these details are intended to be exemplary and in no way delimit the scope of the inventive subject matter. Note that the term "battery" is used herein to depict a generic chemical energy storage system and could be replaced, supplemented, or hybridized with other portable energy storage systems (e.g., solid-state batteries, reversable fuel cells, ultra-capacitors). Also, while many of the examples used are of a wireless power transfer (WPT) system used to power the onboard systems and charge the batteries of a stationary electric vehicle (EV), this use is by no means the only use contemplated.

High-power inductive wireless charging systems are inherently high quality (load invariant) AC current sources. Those skilled in the art will appreciate that all resonant networks transition from voltage sources to current sources at a point defined by a ratio between the impedance of the resonant network and the load. At sufficiently high power, the impedance network may behave as a current source across the entire power range. At such high power, precision and accuracy of measurements can be distorted with many measurement techniques and necessary circuitry is simply unavailable. Quick detection of a series-arc fault in a high power, alternating current system is difficult due to the still active load circuitry. In addition, the probability of a sustained series-arc causing a chain reaction of damage is amplified in direct current (DC) systems since the constant current does not allow cooling between arc termination and reignition as in an alternating current (AC) system.

While the formation of a sustained conductive plasma path from a series-arc does create a distinct "pink" noise source, this characteristic may be distorted by the attenuation, frequency changes, and phase shifts created by the load. The pink noise signal also may be corrupted by thermal noise and induced electromagnetic interference (EMI).

In a WPT system, use of an inductively coupled primary and secondary coil to generate a constant AC current source magnifies the difficulty of detecting a series-arc fault. Addition of a rectifier to the WPT to generate a DC source to charge a battery pack (e.g., in an electric vehicle) further complicates the detection (and mitigation) of a series-arc fault even more as the battery pack itself acts as a constant voltage DC power source. The WPT signal, once rectified, behaves as a high quality (load invariant) DC current source. The nominal load retained in a series-arc fault makes accuracy at high power levels difficult to scale due to sensor saturation at high DC voltages and currents.

The passive series-arc fault detection system described herein is designed to operate in a noisy, high current, high voltage operational environment on a continual basis to passively detect such series-arc faults and to act to mitigate such faults.

FIG. 1

FIG. 1 schematically illustrates a high-level exemplary circuit implementation of a safety enhanced magnetic resonant induction system for the charging of batteries and powering of DC circuitry in a wireless power transfer system. One implementation of this system can be used in the wireless charging of electric vehicles.

In FIG. 1, the ground-side electronics 101 provide connection to the local electrical supply and provide voltage leveling and electrical signal shaping. The ground assembly (GA) 102 consists of the primary coil 103 and a balanced capacitance 104 and 105 to provide the source of the resonant magnetic signal. The vehicle assembly (VA) 106 includes the secondary coil 107 with balanced capacitors 108 and 109 to provide the receiver for the resonant magnetic signal. The primary 103 and secondary 107 comprise an open-air transformer with an inter-coil gap 110. In sample embodiments, multiple GA 102 and VA 106 pairs may be deployed in parallel to increase the total power transfer available.

The generated current in the VA 106 is passed from the VA 106 via low resistance electrical bus 115 to the rectifier 116 of the output network 111. In a sample embodiment, the active rectifier 116 includes a synchronous rectification circuit having paired normally open (NO) switches 117 and 118 and paired normally closed (NC) switches 119 and 120. The rectified signal is passed via a low resistance, high-capacity power bus 124 to the signal conditioning circuitry 125. The output of the signal conditioning circuitry 125 is a conditioned DC signal used to charge the battery 126.

The rectifier controller 113 phase locks to the resonant network current using the first current and voltage sensor 114 as a reference for controlling the timing of the rectifier switches 117, 118, 119, and 120. The rectifier controller 113 (nominally a Field Programmable Gate Array (FPGA) or conventional microcontroller) produces estimates of the amplitude, frequency, and instantaneous phase of the input AC waveform from the secondary coil 107 carried by the high-capacity AC power bus 115 via the first current and voltage sensor 114 and received via link 112 whenever the AC waveform is of sufficient amplitude and the switching frequency is within its acquisition range. The rectifier controller 113 also monitors amplitude of the output DC current waveform applied to the battery 126 via the second current and voltage sensor 127 and datalink 128.

The vehicle charging processor 129 (nominally implemented as software running on a microprocessor) handles communication with internal (to the WPT system) subsystems and external vehicle systems via interfaces (e.g., a controller area network (CAN) bus) and can command the actions of the rectifier controller 113. For example, when queried by the vehicle charging processor 129, the rectifier controller 113 may report the input AC signal amplitude, input AC signal frequency, DC output voltage and current and the switching devices' temperature. If the reported input switching frequency is within the allowed closed range (e.g., 79 kHz to 90 kHz), the AC root mean square (RMS) is above a threshold (e.g., 5 Amps), and there are no detected faults, then the vehicle charging processor 129 may instruct the rectifier controller 113 to turn the upper switch pair 117 and 118 and the lower switch pair 119 and 120 on-and-off via control link 121 at the appropriate zero-crossings of the input AC waveform to maximize the efficiency of rectification. The nominal state is "startup" or "safe" where the upper pair of NO switches 117 and 118 are open and the lower pair of NC switches 119 and 120 are closed. When the secondary coil 107 is producing a positive signal, the first set of switches 117 and 119 are opened and the second set of switches 118 and 120 are closed. When the signal from the secondary coil 107 inverts, the first set of switches 117 and 119 are closed and the second set of switches 118 and 120 are opened. This sequence repeats, resulting in an output signal which is mathematically the absolute value of the input AC signal.

If disabled by the vehicle charging processor 129, the rectifier controller 113 holds the upper NO switch pair 117 and 118 off and the lower NC switch pair 119 and 120 on. If an over-voltage, over-current fault condition is detected at the second current and voltage sensor 127 or an over-temperature fault condition is detected at temperature sensor 123 and provided to the rectifier controller via link 122, the rectifier controller 113 holds the upper NO switch pair 107 and 108 Off and lower NC switch pair 109 and 110 On.

The rectifier controller 113 monitors the output DC voltage from the rectification stage 116 via sensor 127. The rectifier controller 113 also measures output DC current via voltage and amplitude sensor 127 and reports the output DC current to the vehicle charging processor 129 so that the system may compute the total power delivered to the battery 126. In addition, the rectifier controller 113 may monitor the temperature sensor or sensors (e.g., a thermistor or network of thermistors) 123 that measures the temperature of the mounting plate of the rectifier's switching devices 117-120. This mounting-plate temperature represents the case temperature of the switching devices 117-120, which is related to the power losses through the switches 117-120.

When paired with a series-series resonant transmitter (not shown), the resonant network 101 is an AC current source. Any condition that open circuits the resonant network 101 results in an unsafe condition. However, the selection of NO switches 117 and 118 and NC switches 119 and 120 for the synchronous rectification stage 116 results in an inherently safe system. In the normal condition, either incidentally or specifically controlled, the NC switches 119 and 120 constitute means for shunting the AC current source of the resonant network 116. The NO switches 117 and 118 prevent shorting the output network 111, particularly the battery 126.

In the event of a fault, the battery 126 is disconnected from the signal conditioning circuitry 125, and the current flow out of the signal conditioning circuitry 125 is reduced to zero while the current flow into the signal conditioning circuitry 125 does not change. This will cause the voltage across the signal conditioning circuitry 125 and rectifier stage 116 to increase at a rate proportional to the rectified current and impedance of the signal conditioning circuitry 125.

The rectifier controller 113 monitors the voltage and/or current using voltage and amplitude sensor 127 to detect the disconnection of the battery 126. In the event of a fault, the rectifier controller 113 may respond by opening switches 117 and 118 and closing switches 119 and 120. This acts to disconnect the AC current source 101 from the signal conditioning circuitry 125 and battery 126. Power transfer will stop immediately as the rectified current flow out of the rectifier stage 116 to the signal conditioning circuitry 125 and battery 126 will be interrupted by switches 117 and 118 and current flow out of the AC current source 101 will be shunted through switches 119 and 120. If a detection shunt event is required, the rectifier controller 113 can be commanded to shunt the rectifier stage 116.

One such detection event is a series-arc detection. The active safety rectifier 116 provides the capability for a series-arc detection scheme that uses passive detection techniques and circuitry reporting to the vehicle charging processor 129 which commands the rectifier controller 113 to immediately de-energize the WPT system by shunting the incoming current from the secondary coil 107.

The safety rectifier 116 also provides for a default safe state, where there is no control power to operate a controller or to synchronously rectify. In the default safe state, the NO switches 117 and 118 open the output network 111 while the NC switches 119 and 120 shunt the resonant network 101. This protects the charger, load and service personnel from spurious energy picked up by the resonant network 101.

Figure 2:
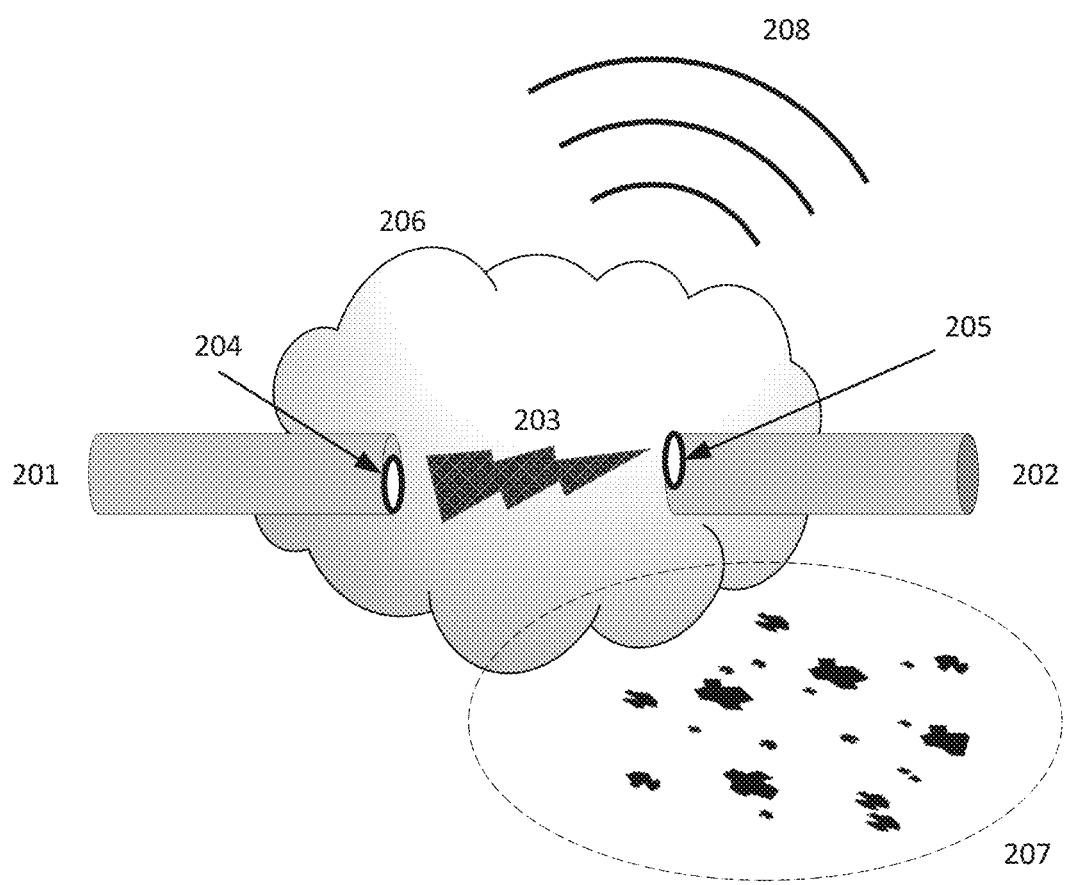
FIG. 2 graphically illustrates a series-arc at the moment of ignition.

Other alternative examples of the architecture and circuitry of the safety rectifier 116 for both switch-based and diode-based rectification can be seen in U.S. patent application Ser. No. 16/952,933, filed Nov. 19, 2020 entitled SAFETY CIRCUITS FOR WIRELESS POWER TRANSFER, which is incorporated herein by reference.
FIG. 2

FIG. 2 portrays a series-arc fault at the moment of ignition. A series-arc occurs when electricity bridges a gap between two or more points within the same phase. Because a series-arc occurs within the same phase, the amount of current is no higher than the load current. Direct Current (DC) makes the series-arc detection difficult, and the current source nature of the magnetic resonance induction coil makes the series-arc detection potentially dangerous. A series arc fault effectively increases the load impedance. In a voltage source, this reduces the current and power output of the source. An unchecked arc would increase in power at first but as its impedance increases, eventually it would push towards self-extinction. However, in a current source the increased impedance increases the voltage of the source as the current is constant. This will cause the power dissipation in the arc to only grow as the impedance of the arc increases.

In FIG. 2, the conductor is divided into first 201 and second 202 segments by, for example, a break or a loose connection. In the case of a break or loose connection, the gap size will vary with time which can allow the arc to strike when the gap is small and once the arc has ignited it can be sustained with a much smaller voltage even as the gap expands. In the case of a break or loose connection the gap size will vary with time which can allow the arc to strike when the gap is small and once the has ignited it can be sustained with a much smaller voltage even as the gap expands. When the voltage is sufficient to overcome the dielectric of the gap, current 203 flows. The current flow 203 is facilitated by the quickly forming puddles of molten conductor 204 and 205 and the plasma cloud 206 formed from the ionized dielectric and the vaporized conductor. The arc ignition can generate a spray of debris 207 consisting of carbonized insulation and conductor droplets (sometimes described as an "explosive expulsion of minute glowing globules of copper"). Ignition of the arc can also be accompanied by a burst of sound 208 in a gaseous or liquid atmosphere.
FIG. 3

The WPT receiver uses an AC/DC rectification stage to convert the AC signal generated at the secondary coil to a DC signal for powering DC systems or charging a battery. At some time, a series-arc fault may initiate at some location in the post rectification (DC) circuitry. This arc generates 1/f ("pink") noise on top of the DC current which already carries an AC (ripple) artifact from the rectification process. Between the arc fault and the detector circuitry, additional noise may be added via crosstalk, signal frequency and phase may be shifted, and the signal (and noise) attenuated. Due to the narrowband input AC from the magnetic resonance WPT system, the highest power DC noise source is limited in spectrum as the post-rectification, post-smoothing ripple retain the same center frequency and thus is easily avoided in measurements.

Electrical arcing is one natural process that creates "pink noise." The formula for pink noise can be written as:

$$P(f)=1/f^{\alpha}, \tag{1}$$

where P is the spectral power and a an exponent determining the "color" of the noise with $\alpha=0$ for "white noise" (white noise is defined as independent of frequency) and $\alpha=1$ for pink noise. Pink noise is characterized as a wideband signal where the power spectrum varies inversely with frequency (i.e., 1/f amplitude). This means that ignition of the arc causes a proportionately large noise increase at lower frequencies.

Figure 3A:
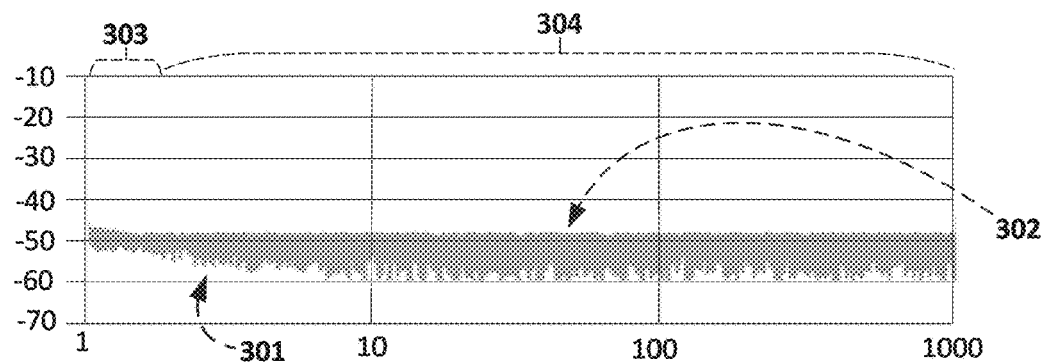
FIG. 3A illustrates the characteristics of pink noise introduced by a minimally detectable series-arc.

FIG. 3A shows an example case of a minimally detectable series-arc fault on a log-log frequency (kHz) to power (dB) graph. The pink noise signature 301 is apparent at low frequencies (below 3 kHz) 303 with sufficient power (~5 dB) for a positive detection. The noise floor 302 dominates over the pink noise for the higher frequency spectrum 304.

Figure 3B:
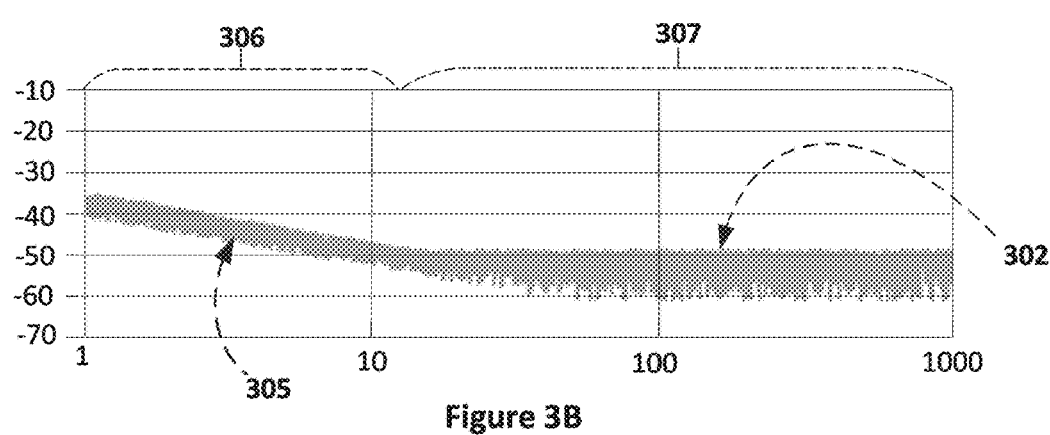
FIG. 3B illustrates the characteristics of pink noise introduced by a small detectable series-arc.

FIG. 3B shows an example case of a low-power series-arc fault on a log-log frequency (kHz) to power (dB) graph. The pink noise signature 305 is apparent at lower frequencies (below 11 kHz) 306 with sufficient power (>10 dB) for a positive detection. The noise floor 302 dominates over the pink noise for the higher frequency spectrum 307. Note as the power of the series-arc increases, the ability to detect the pink-noise generated at higher frequencies increases as the statistical likelihood of a false positive decreases.

Figure 3C:
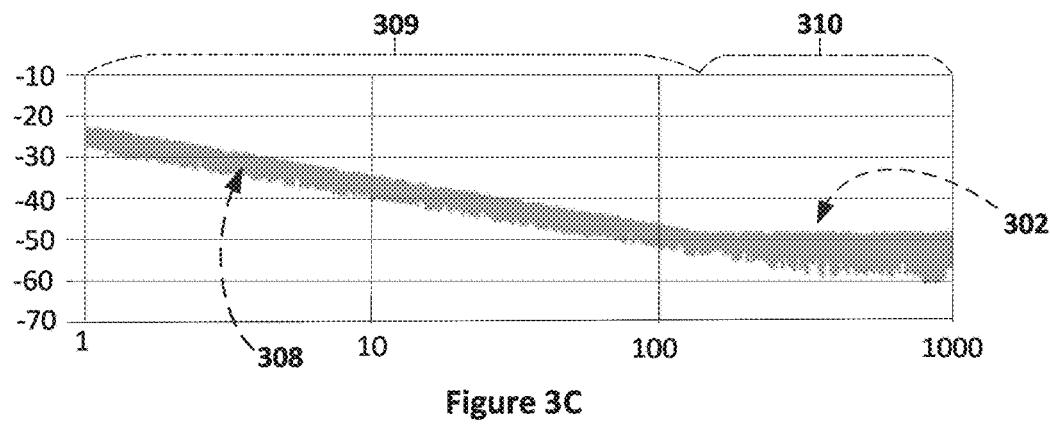
FIG. 3C illustrates the characteristics of pink noise introduced by a large series-arc.

FIG. 3C shows an example case of a high-power series-arc fault on a log-log frequency (kHz) to power (dB) graph. The pink noise signature 308 is apparent at lower frequencies (below 120 kHz) 309 with sufficient power (>25 dB) for a positive detection. The noise floor 302 dominates over the pink noise 308 for the higher frequency spectrum 310.

Figure 3D:
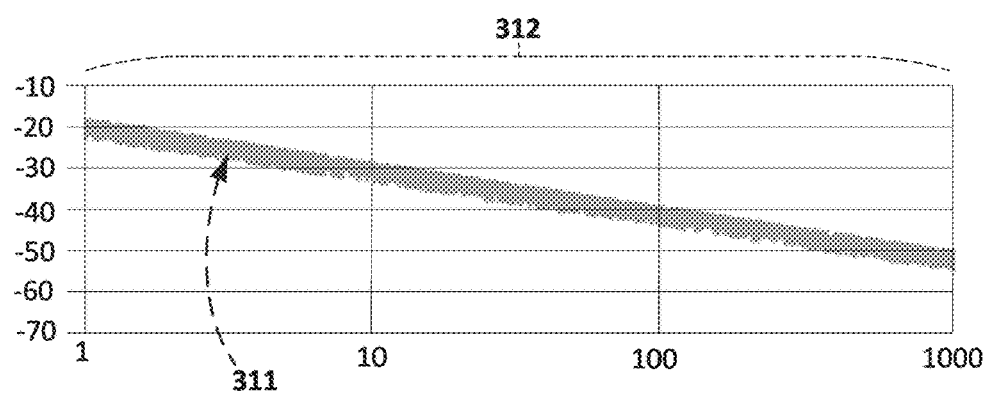
FIG. 3D illustrates the characteristics of pink noise introduced by the largest series-arc.

FIG. 3D shows an example case of an extremely high-power series-arc fault on a log-log frequency (kHz) to power (dB) graph. The pink noise signature 311 is apparent at all shown frequencies (below 1000 kHz) 312 with sufficient power (>30 dB) for a positive detection.

FIG. 4

Figure 4:
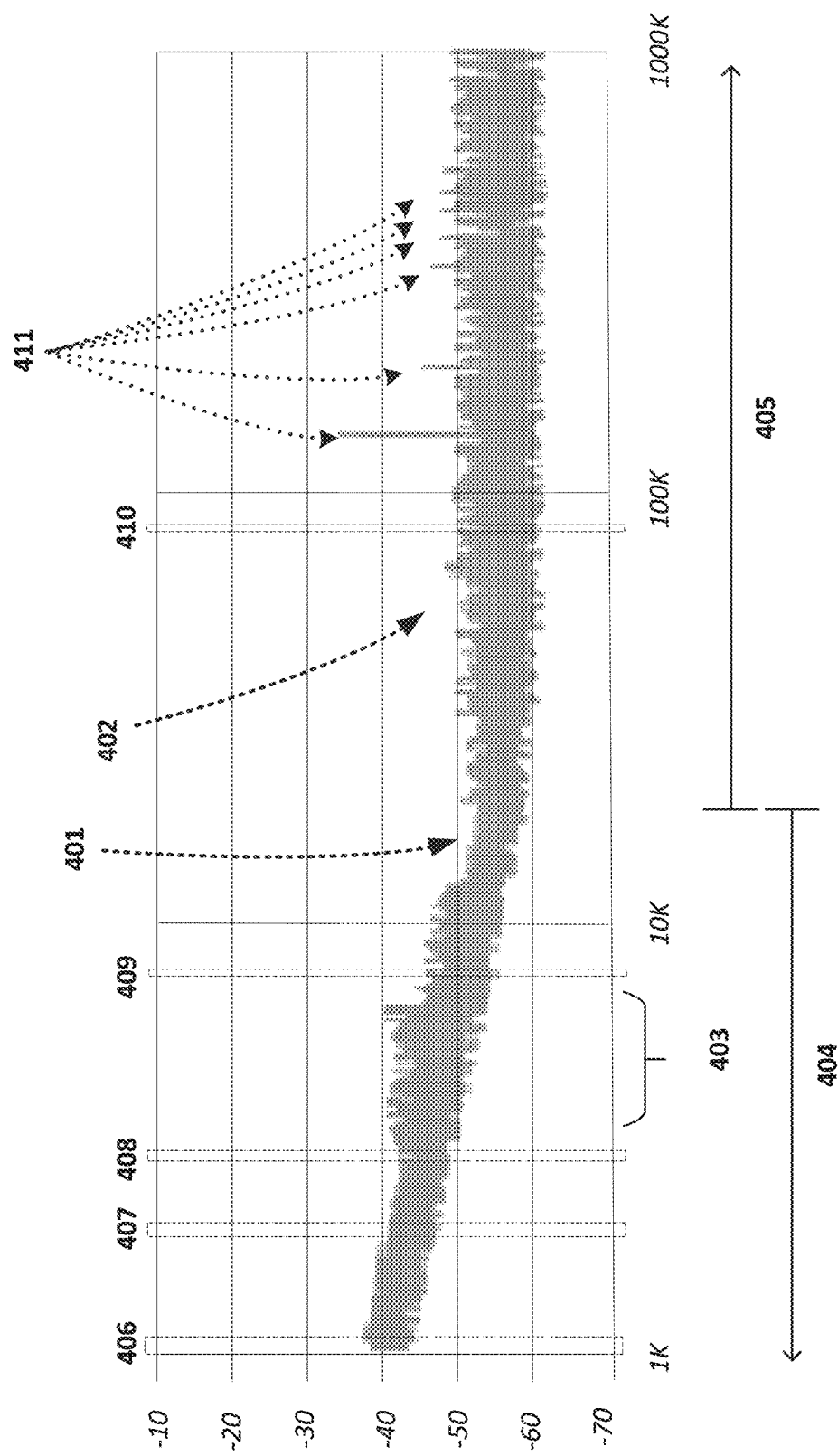
FIG. 4 depicts an exemplary series-arc noise spectrum with detection frequency selections.

FIG. 4 depicts an exemplary series arc noise spectrum with detection frequency selections after rectification. FIG. 4 shows of an example case where continuous or periodic passive scanning of a set of frequencies 406-410 is performed to detect the presence of pink-noise and thus a series arc fault. Shown on a log-log frequency (kHz) to power (dB) graph, the spectral characteristics of the signal 401 received at the detector is shown. The detector circuitry is incorporated into the DC stage (post-rectifier) of the WPT system. The detector circuitry is designed to remove the DC signal component, resulting in the detection signal 401. In this example of the detection signal 401, pink-noise can be seen over the lower frequency spectrum 404 but not the upper frequency spectrum 405. Post-rectification, the narrowband 85 kHz AC charging signal 402 has been completely removed. Examples of additional additive noise sources (external to the WPT assembly and application (e.g., electric vehicle (EV) charging) specific) are shown in the 6-8 kHz range 403.

The frequency windows 406, 407, 408, 409, and 410 are selected to avoid known noisy frequency ranges (that is noise in addition to the normal white noise). Shown in this example, the window frequencies are heavily distributed to the low frequency ranges both to better identify pink noise generated by small arcs, but also to avoid the harmonics 411 from the charging signal.

FIG. 5

Figure 5:
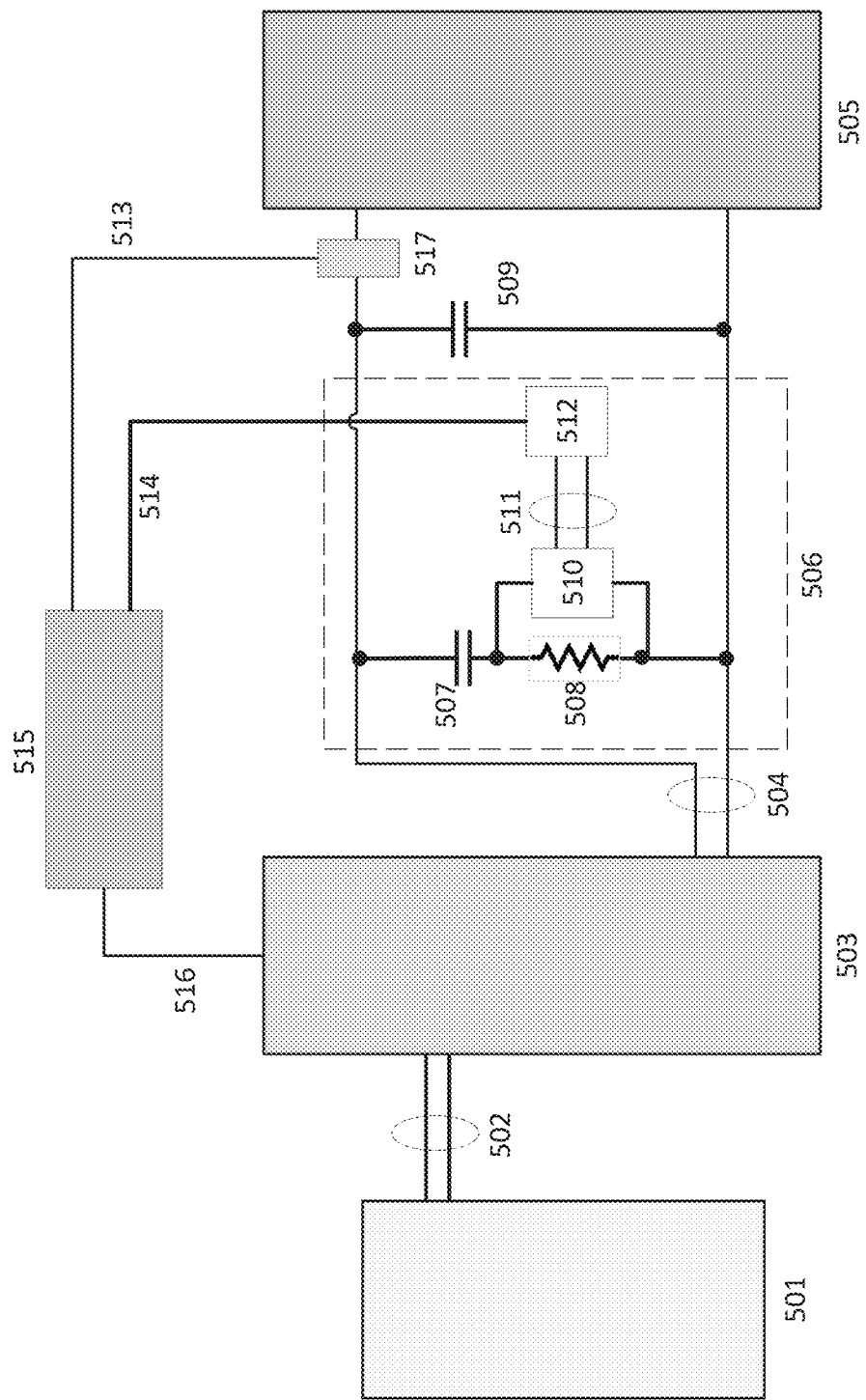
FIG. 5 schematically depicts an exemplary circuit for passive series-arc detection in a sample embodiment.

FIG. 5 schematically depicts an exemplary circuit for series-arc detection in sample embodiments. FIG. 5 depicts the receiver subsystem (aka secondary) of a wireless power transfer (WPT) system for the powering of electronics and charging of energy storage systems (e.g., chemical or solid-state batteries, reversable fuel cells, ultra-capacitors, etc.). One application for such a system is the charging of an electric vehicle. The embodiment of FIG. 5 is a high-level depiction including the circuitry needed for passive detection of a series-arc by detecting the addition of pink noise.

In a WPT system using a magnetic resonance inductive circuit, the resonant network 501 is a high-quality current source with a center frequency of 85,000 Hertz (nominally allowed to range between 79-90 kHz). The impedance of the resonant network allows it to source current within a narrow band of the resonant frequency and harmonics. The rectifier 503 turns the narrow band AC current received over AC electrical bus 502 into DC current with harmonics at even multiples of the fundamental frequency. The rectifier stage 503 in FIG. 5 may be a safety rectifier of the type taught in U.S. patent application Ser. No. 16/952,933, filed Nov. 19, 2020, entitled "SAFETY CIRCUITS FOR WIRELESS POWER TRANSFER." The harmonic currents from the rectifier 503 are shunted by the arc-detection circuitry 506, and the DC currents pass through the output current sensor 512 to the vehicle charging controller 515. When a series arc occurs in the load 505, it draws a wide bandwidth current with a pink spectral signature. A 'fractional current sensor' of the type described in U.S. patent application Ser. No. 16/825,624, filed Mar. 20, 2020, entitled "CURRENT SENSING IN A WIRELESS POWER TRANSFER SYSTEM" may be used to provide current sensing in the AC electrical bus 502 and the DC electrical bus 504 in sample embodiments.

In the embodiment of FIG. 5, the charging signal is delivered to the secondary coil assembly of the resonant network 501 via magnetic flux for conversion into an electrical current. The received AC electrical signal is delivered by the high-power wired AC bus 502 to the rectification subsystem 503. The AC signal is rectified to a DC signal suitable for battery charging before being delivered via the high-power DC bus 504 to the power storage subsystem 505.

To allow for passive arc detection, arc-detection circuitry 506 is inserted between the rectification subsystem 503 and the power storage subsystem 505. Two new parallel paths are created. The first path includes a filter capacitor 507 and a sense resistor 508. The second path includes the smoothing capacitor 509. Both the first and second paths are in parallel with each other and the power load/storage subsystem 505. Any pre-existing smoothing capacitor or capacitor bank is included in the smoothing capacitor 509.

The current sense resistor 508 will only be exposed to the ripple current (AC current noise on the rectified DC base). By putting the current sensing resistor 508 in line with the filter capacitor 507, the arc-detection circuitry 506 eliminates the DC load current from the rectification subsystem 503 and allows a voltage measurement of the noise that is added to the DC load current.

The voltage produced over the sense resistor 508 is bandpass filtered and amplified by the low noise amplifier (LNA) 510. Since the characteristic (1/frequency) pink noise signal amplitude is directly related to the size and severity of the arc fault, such amplification may be used to detect smaller arc faults than allowed by the digitizer's 512 own self-induced noise sources (e.g., code transition noise, differential nonlinearity, input-referred noise) as well as the quantization noise which limits the lower detection range. The filtered and amplified voltage is passed over a bus 511 to the digitizer 512 (nominally an Analog to Digital Converter with high dynamic range). The digitizer 512 samples the pre-filtered and amplified voltage at a frequency over the expected Nyquist rate. This digital information is sent to the vehicle charging controller 515 for analysis via digital datalink 514. If a series-arc is detected during analysis of the digital information by a processor of the vehicle charging controller 515, the vehicle charging controller 515 can command the safety rectifier 503 via control datalink 516 to shunt current to reduce a DC output of the rectifier 503 toward zero until a full system shutdown can execute and the magnetic flux charging signal is terminated. The vehicle charging controller 515 may further monitor an amplitude of the DC current waveform applied to the power load/storage subsystem 505 via the current and voltage sensor 517 and datalink 513.

FIG. 6

Figure 6:
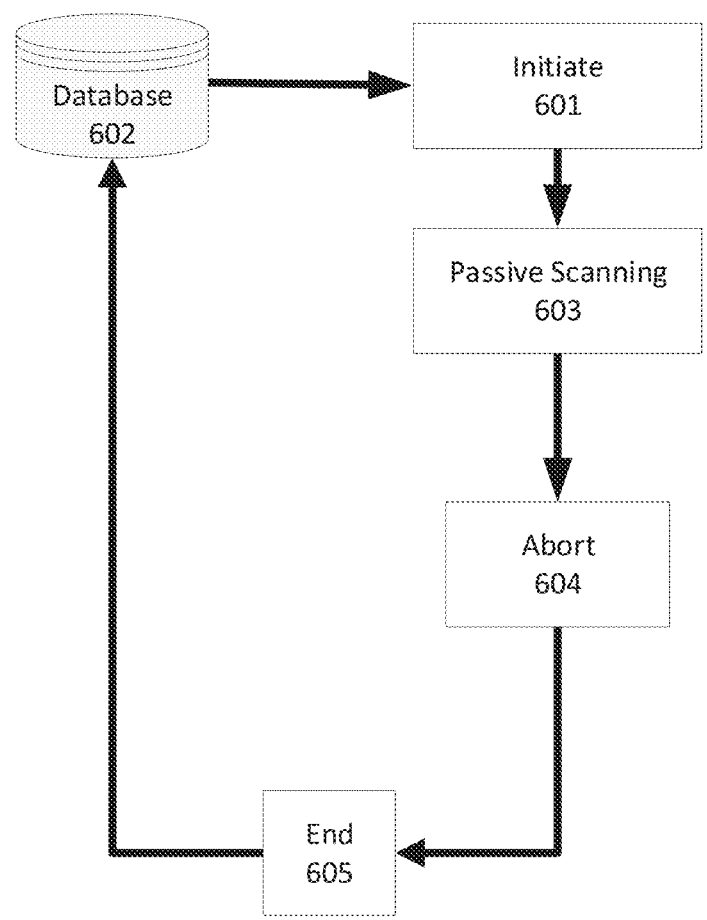
FIG. 6 illustrates graphically the process for passive arc detection and mitigation in a sample embodiment.

FIG. 6 illustrates graphically the process for passive arc detection and mitigation in a sample embodiment.

As illustrated in FIG. 6, initiation 601 of the passive arc detection process can involve communication with a database 602 (located remotely, locally, or on-board the electric vehicle) where characteristics of the receiver assembly, charging station (if present), past charging history, or other information may be obtained. This information may be used to inform scanning cycle periodicity, abort the charging session immediately, set the number of frequencies to scan, and/or adjust the frequency window(s) to avoid known local noise, ambient noise, or interferers.

Passive scanning 603 is a repeated stage where information on the additive noise on the rectified DC signal characteristics received from the arc-detection circuitry 506 is collected. In one example, the amplitude differences between two-or-more frequencies may be used to determine if the power spectral density (power per frequency interval) is inversely proportional to the frequency of the signal. Both repeated indications of pink noise in a frequency range and over multiple ranges in frequencies may be used in the determination of a detection event. A detection event may be subjected to additional signal and historical analysis to judge statistically the likelihood of a false positive detection.

A high probability passive detection during passive scanning 603 by scanning means (e.g., software implementing the flow chart of FIG. 7) of a processor of the vehicle charging controller 515, e.g., one above a quality threshold, may trigger an abort 604 of the charging session. If the charging session is aborted 604, the vehicle charging controller 515 engages a shunt circuit in the safety rectifier circuit 503 to shunt current until the ground station charging coil is de-energized. During the abort 604, local alarms, announcements, and indicators are issued and communication to the ground assembly is provided to terminate the charging session. Ancillary systems (e.g., ventilation, fire detection, fire suppression) are engaged as needed or are made available.

Once the ground station charging coil is de-energized, the end stage 605 is reached and the database 602 updated with collected data relating to the detection event and the vehicle characteristic (e.g., EV make, EV model, software packages and revisions installed, battery make, model, voltage, capacity, etc.).

FIG. 7

Figure 7:
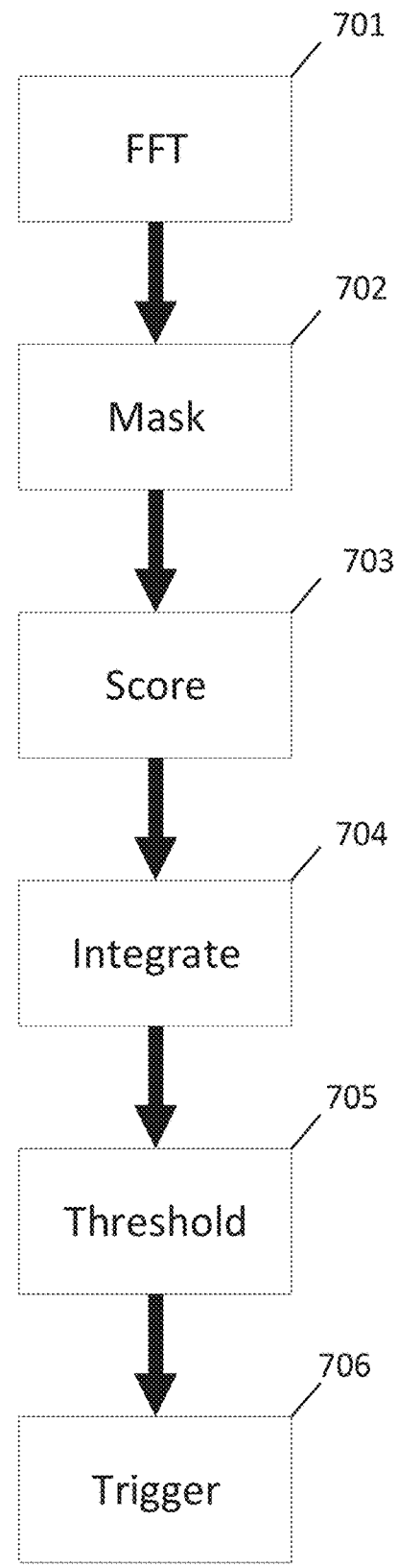
FIG. 7 illustrates a flow chart of the signal analysis for passive scanning in a sample embodiment.

FIG. 7 illustrates a flow chart of the signal analysis for passive scanning in a sample embodiment.

As illustrated in FIG. 7, once the signal data has been collected, a time domain to frequency domain transformation (e.g., a Fast Fourier Transform (FFT)) calculation 701 is performed. The FFT results are masked 702 to remove known external interference and noise sources (e.g., inverter switching, signal harmonics). A score 703 is developed based on the fit of the masked result to the 1/f amplitude characteristic of pink noise. An n-sample integration 704 is performed to average the score over a time duration. For each n-samples duration, the integrated score is compared 705 to a threshold value. If the threshold is exceeded, then a detection 706 is triggered by the passive series-arc detection system. In sample embodiments, the signal analysis may be performed by software running on a processor of the vehicle charging controller 515. As noted above with respect to FIG. 5, if a series-arc is detected, the vehicle charging controller 515 can command the safety rectifier 503 via control datalink 516 to shunt current to reduce a DC output of the rectifier 503 toward zero until a full system shutdown can execute and the magnetic flux charging signal is terminated.

CONCLUSION

While various implementations have been described above, it should be understood that they have been presented by way of example only, and not limitation. For example, any of the elements associated with the systems and methods described above may employ any of the desired functionality set forth hereinabove. Thus, the breadth and scope of a preferred implementation should not be limited by any of the above-described sample implementations.

As discussed herein, the logic, commands, or instructions that implement aspects of the methods described herein may be provided in a computing system including any number of form factors for the computing system such as desktop or notebook personal computers, mobile devices such as tablets, netbooks, and smartphones, client terminals and server-hosted machine instances, and the like. Another embodiment discussed herein includes the incorporation of the techniques discussed herein into other forms, including into other forms of programmed logic, hardware configurations, or specialized components or modules, including an apparatus with respective means to perform the functions of such techniques. The respective algorithms used to implement the functions of such techniques may include a sequence of some or all of the electronic operations described herein, or other aspects depicted in the accompanying drawings and detailed description below. Such systems and computer-readable media including instructions for implementing the methods described herein also constitute sample embodiments.

The monitoring and control functions of the rectifier controller 113, vehicle charging processor 129, and/or vehicle charging controller 515 described herein may be implemented in software in one embodiment. The software may consist of computer executable instructions stored on computer readable media or computer readable storage device such as one or more non-transitory memories or other type of hardware-based storage devices, either local or networked. Further, such functions correspond to modules, which may be software, hardware, firmware, or any combination thereof. Multiple functions may be performed in one or more modules as desired, and the embodiments described are merely examples. The software may be executed on a digital signal processor, ASIC (Application Specific Integrated Circuit), microprocessor, or other type of processor operating on a computer system, such as a personal computer, server, or other computer system, turning such computer system into a specifically programmed machine.

Examples, as described herein, may include, or may operate on, processors, logic, or a number of components, modules, or mechanisms (herein "modules"). Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. The software, when executed by the underlying hardware of the module, causes the hardware to perform the specified operations.

Accordingly, the term "module" is understood to encompass a tangible hardware and/or software entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

Those skilled in the art will appreciate that the topology and circuit implementation methodology described herein enables effective realization as a single application specific integrated circuit. Further, while the disclosure contained herein pertains to the provision of electrical power to vehicles, it should be understood that this is only one of many possible applications, and other embodiments including non-vehicular applications are possible. For example, those skilled in the art will appreciate that there are numerous applications of providing a current source safety circuit in non-vehicle inductive charging applications such as portable consumer electronic device chargers, such as those (e.g., PowerMat™) used to charge toothbrushes, cellular telephones, and other devices. Accordingly, these and other such applications are included within the scope of the following claims.

What is claimed:

1. A method of charging a battery, comprising:
   rectifying, using a rectifier, power received from an alternating current (AC) power source into a direct current (DC) signal for application to the battery for charging;
   measuring, using an arc detection circuit comprising a sense resistor in line with a filter capacitor, pink noise added to the DC signal by digitizing a voltage across the sense resistor as a measured noise signal;
   analyzing the measured noise signal to detect a series-arc; and
   when a series-arc is detected, causing a shunt of AC current of the rectifier for a period of time to reduce a DC output of the rectifier toward zero.

2. A method as in claim 1, wherein measuring pink noise added to the DC signal comprises:
   inserting a passive arc detection circuit between the rectifier and the battery, the passive arc detection circuit comprising a first path including the filter capacitor in line with the sense resistor and a second path in parallel with the first path and the battery, the second path including a smoothing capacitor;
   digitizing the voltage across the sense resistor; and
   outputting the digitized voltage as the measured noise signal.

3. A method as in claim 2, further comprising amplifying the voltage across the sense resistor.

4. A method as in claim 1, wherein generating the measured noise signal comprises the arc detection circuit scanning a DC frequency spectrum of a DC output with additive noise of the rectifier to obtain the measured noise signal in a frequency window and comparing the measured noise signal to a detection threshold for the frequency window.

5. A method as in claim 4, further comprising:
   receiving, from a database, information relating to a receiver assembly including the rectifier, the information including at least one of data used to inform scanning cycle periodicity, to abort a charging session immediately, to set a number of frequencies to scan, or to adjust at least one frequency window to avoid local noise, ambient noise, or interference; and
   after scanning the DC frequency spectrum of the DC output of the rectifier to obtain the measured noise signal in the frequency window, detecting a series-arc when a detection threshold for the frequency window is exceeded.

6. A method as in claim 5, further comprising subjecting a series-arc detection event indicating detection of the series-arc to signal and historical analysis to determine a probability of a false positive detection.

7. A method as in claim 1, wherein analyzing the measured noise signal to detect a series-arc comprises:
   performing a Fourier Transform (FT) calculation on the measured noise signal to generate FT results;
   masking the FT results to derive results for pre-selected frequency windows of the DC current output of the rectifier;
   for each pre-selected frequency window, developing a score based on a frequency amplitude;
   performing an n-sample integration to average the score over an n-sample time duration to generate an integrated score, where n is a number of samples;
   for each n-sample time duration, comparing the integrated score to a threshold; and
   when the threshold is exceeded by the integrated score, triggering a series-arc detection event.

8. A charging system for charging a battery, comprising:
   a rectifier that rectifies power received from an alternating current (AC) power source into a direct current (DC) signal for application to the battery for charging;
   an arc detection circuit comprising a sense resistor in line with a filter capacitor that measures pink noise added to the DC signal and generates a measured noise signal by digitizing a voltage across the sense resistor; and
   a processor that analyzes the measured noise signal to detect a series-arc and, when a series-arc is detected, causes a shunt of AC current of the rectifier for a period of time to reduce a DC output of the rectifier toward zero.

9. A charging system as in claim 8, wherein the arc detection circuit comprises a passive arc detection circuit disposed between the rectifier and the battery, the passive arc detection circuit comprising:
   a first path including the filter capacitor in line with the sense resistor;
   a second path in parallel with the first path and the battery, the second path including a smoothing capacitor; and
   an analog to digital converter that digitizes the voltage across the sense resistor and outputs the digitized voltage as the measured noise signal.

10. A charging system as in claim 9, further comprising an amplifier that amplifies the voltage across the sense resistor.

11. A charging system as in claim 8, wherein the processor scans a DC frequency spectrum of a DC output with additive noise of the rectifier to obtain the measured noise signal in a frequency window and compares the measured noise signal to a detection threshold for the frequency window.

12. A charging system as in claim 11, further comprising a database that provides to the processor information relating to a receiver assembly including the rectifier, the information including at least one of data used to inform scanning cycle periodicity, to abort a charging session immediately, to set a number of frequencies to scan, or to adjust at least one frequency window to avoid local noise, ambient noise, or interference, wherein after scanning the DC frequency spectrum of the DC output of the rectifier to obtain the measured noise signal in the frequency window, the processor detects a series-arc when a detection threshold for the frequency window is exceeded.

13. A charging system as in claim 12, wherein the processor further subjects a series-arc detection event indicating detection of the series-arc to signal and historical analysis to determine a probability of a false positive detection.

14. A charging system as in claim 8, wherein the processor executes instructions to analyze the measured noise signal to detect a series-arc by performing operations comprising:
   performing a Fourier Transform (FT) calculation on the measured noise signal to generate FT results;

masking the FT results to derive results for pre-selected frequency windows of the DC current output of the rectifier;

for each pre-selected frequency window, developing a score based on a frequency amplitude;

performing an n-sample integration to average the score over an n-sample time duration to generate an integrated score, where n is a number of samples;

for each n-sample time duration, comparing the integrated score to a threshold; and when the threshold is exceeded by the integrated score, triggering a series-arc detection event.

* * * * *